(12) United States Patent
Chung et al.

(10) Patent No.: US 9,105,865 B2
(45) Date of Patent: Aug. 11, 2015

(54) ORGANIC LIGHT EMITTING DISPLAY APPARATUS, METHOD OF MANUFACTURING THE SAME, AND MASK USED IN THE METHOD

(71) Applicant: SAMSUNG DISPLAY CO., LTD., Yongin, Gyeonggi-Do (KR)

(72) Inventors: Jin-Koo Chung, Yongin (KR); Jun-Ho Choi, Yongin (KR); Seong-Min Kim, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 90 days.

(21) Appl. No.: 13/973,520

(22) Filed: Aug. 22, 2013

(65) Prior Publication Data

US 2014/0326958 A1 Nov. 6, 2014

(30) Foreign Application Priority Data

May 2, 2013 (KR) .................. 10-2013-0049608

(51) Int. Cl.
*H01J 1/62* (2006.01)
*H01L 51/52* (2006.01)
*H01L 51/56* (2006.01)

(52) U.S. Cl.
CPC ............ *H01L 51/5203* (2013.01); *H01L 51/56* (2013.01)

(58) Field of Classification Search
CPC . H01L 51/56; H01L 27/3244; H01L 27/3246; H01L 27/3211

USPC .................................................. 313/504, 506
See application file for complete search history.

(56) References Cited

U.S. PATENT DOCUMENTS

| 6,784,009 B2 | 8/2004 | Lim et al. |
| 2008/0070466 A1 | 3/2008 | Chu et al. |
| 2009/0200936 A1 | 8/2009 | Kang et al. |
| 2012/0104422 A1 | 5/2012 | Lee et al. |

FOREIGN PATENT DOCUMENTS

| KR | 1020090045681 | 5/2009 |
| KR | 1020090087267 | 8/2009 |
| KR | 1020120044876 | 5/2012 |

OTHER PUBLICATIONS

Korean Office Action Issued by the Korean Industrial Property Office on Mar. 30, 2015 in the examination of Korean Patent Application No. 10-2013-0049608.

*Primary Examiner* — Vip Patel
(74) *Attorney, Agent, or Firm* — F. Chau & Associates, LLC

(57) ABSTRACT

A method of manufacturing an organic light emitting display apparatus is provided. A plurality of first electrodes is formed on a substrate. An intermediate layer including an emission layer is formed on the plurality of first electrodes. A deposition mold including a plurality of auxiliary patterning lines is formed by performing a deposition process twice using a mask. The mask includes a plurality of aperture sets, each of the plurality of aperture sets corresponding to part of each of the plurality of auxiliary patterning lines. A plurality of second electrodes is formed on the intermediate layer by depositing a conductive material into the deposition mold.

15 Claims, 6 Drawing Sheets

ORGANIC LIGHT EMITTING DISPLAY APPARATUS, METHOD OF MANUFACTURING THE SAME, AND MASK USED IN THE METHOD

CROSS-REFERENCE TO RELATED PATENT APPLICATION

This application claims priority under 35 U.S.C. §119 to Korean Patent Application No. 10-2013-0049608, filed on May 2, 2013, in the Korean Intellectual Property Office, the disclosure of which is incorporated by reference herein in its entirety.

TECHNICAL FIELD

The present invention relates to a display apparatus, a method of manufacturing the organic light emitting display apparatus, and more particularly, to an organic light emitting display apparatus, a method of manufacturing the same, and a mask in manufacturing the organic light emitting display apparatus.

DISCUSSION OF RELATED ART

Organic light emitting display apparatuses include organic light emitting devices. The organic light emitting devices include an intermediate layer interposed between a pixel electrode and an opposite electrode as a (sub-) pixel. The intermediate layer includes an emission layer. Organic light emitting display apparatuses further include a thin film transistor (TFT) that controls light emission or a degree of light emission of a pixel. The thin film transistor (TFT) is electrically connected to the pixel electrode, and the opposite electrode is formed throughout a plurality of (sub-) pixels.

SUMMARY OF THE INVENTION

According to an exemplary embodiment of the present invention, an organic light emitting display apparatus including a substrate, a plurality of first electrodes, a plurality of second electrodes, an intermediate layer and an auxiliary patterning layer. The substrate includes a display area on which a plurality of pixels are disposed and a peripheral area adjacent the display area. The plurality of first electrodes is located in the display area. The plurality of second electrodes is formed as stripes and is located in the display area. The plurality of second electrodes extends in a first direction and is arranged in a second direction that crosses the first direction. An intermediate layer is interposed between the plurality of first electrodes and the plurality of second electrodes. The intermediate layer includes an emission layer. The auxiliary patterning layer is disposed between two adjacent second electrodes of the plurality of second electrodes. The auxiliary patterning layer has a non-uniform thickness along the first direction.

According to an exemplary embodiment of the present invention, a method of manufacturing an organic light emitting display apparatus is provided. A plurality of first electrodes is formed on a substrate. An intermediate layer including an emission layer is formed on the plurality of first electrodes. A deposition mold including a plurality of auxiliary patterning lines is formed by performing a deposition process twice using a single mask. The mask includes a plurality of aperture sets, each of plurality of aperture sets corresponding to part of each of the plurality of auxiliary patterning lines. A plurality of second electrodes is formed on the intermediate layer by depositing a conductive material into the deposition mold.

According to an exemplary embodiment of the present invention, a mask for forming a deposition mold includes a plurality of first aperture sets, a plurality of second apertures, and a plurality of third apertures. The plurality of first aperture sets is arranged in a second direction. Each of the plurality of first aperture sets includes a plurality of first apertures spaced apart from each other in the first direction crossing the second direction. Each of the plurality of first apertures extends along the first direction. The plurality of second apertures is spaced apart from each other in the second direction and is disposed on one side of the mask. The plurality of third apertures is spaced apart from each other in the second direction and is disposed on an opposite side of the mask. Each of the plurality of third apertures includes a first bent portion extended in the first direction and a second bent portion extended in the second direction. The plurality of first aperture sets is disposed between the plurality of second apertures and the plurality of third apertures.

BRIEF DESCRIPTION OF THE DRAWINGS

These and other features of the present invention will become more apparent by describing in detail exemplary embodiments thereof with reference to the accompanying drawings of which.

DETAILED DESCRIPTION OF THE INVENTION

Figure 1:
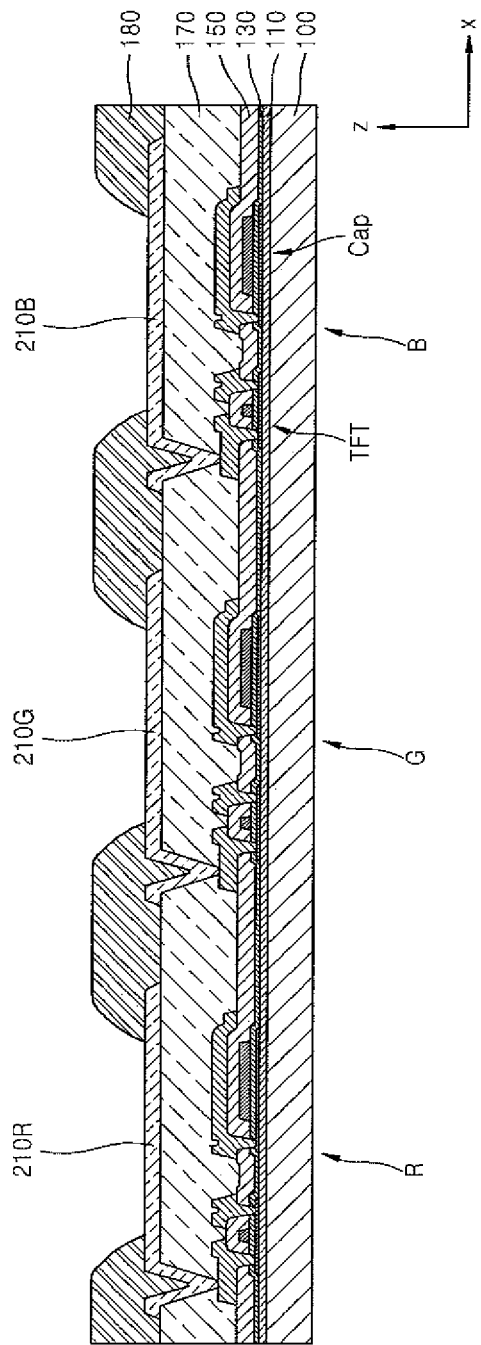
FIGS. 1 through 3 are diagrams illustrating processes of manufacturing an organic light emitting display apparatus according to an exemplary embodiment of the present invention.

Exemplary embodiments of the present invention will be described below in detail with reference to the accompanying drawings. However, the present invention may be embodied in different forms and should not be construed as limited to the embodiments set forth herein. In the drawings, the thickness of layers and regions may be exaggerated for clarity. It will also be understood that when a layer is referred to as being "on" another layer or substrate, it may be directly on the other layer or substrate, or intervening layers may also be present. Like reference numerals may refer to the like elements throughout the specification and drawings.

Hereinafter, x-axis, y-axis, and z-axis are not limited to axes on an orthogonal coordinate system, but may be interpreted widely. For example, the x-axis, the y-axis, and the z-axis may cross each other at right angles; they, however, may denote different directions that do not cross each other at right angles.

FIGS. 1 through 3 and FIGS. 7 through 9 are schematic diagrams illustrating a process of manufacturing an organic light emitting display apparatus according to an exemplary embodiment of the present invention.

First, as shown in FIG. 1, a backplane is prepared. Here, the backplane includes at least a substrate 100, a plurality of first electrodes 210R, 210G, and 210B formed on the substrate 100, and a pixel defining layer 180. The pixel defining layer 180 exposes part of the plurality of first electrodes 210R, 210G, and 210B. For example, the pixel defining layer 180 exposes center portions of the first electrodes 210R, 210G, and 210B. Here, the pixel defining layer 180 may protrude from regions between the plurality of first electrodes 210R, 210G, and 210B in a positive z-axis direction.

The substrate 100 may include various materials, for example, glass, metal, or plastic such as polyethylene terephthalate (PET), polyethylene naphthalate (PEN), or polyimide. The substrate 100 may include a display area on which a plurality of pixels are formed, and a peripheral area surrounding the display area.

The plurality of first electrodes 210R, 210G, and 210B may serve as pixel electrodes. Hereinafter, the pixel electrode 210B may be referred to as a first pixel electrode, the pixel electrode 210R may be referred to as a second pixel electrode, and the pixel electrode 210G may be referred to as a third pixel electrode. According to an exemplary embodiment, intermediate layers are formed on the first through third pixel electrodes and the intermediate layers may include different materials from each other. The intermediate layers will be explained in detail below.

The pixel electrodes 210R, 210G, and 210B may include transparent or semi-transparent electrodes or reflective electrodes. For example, if the pixel electrodes 210R, 210G, and 210B include semi-transparent electrodes, the pixel electrodes 210R, 210G, and 210B may include indium tin oxide (ITO), indium zinc oxide (IZO), zinc oxide (ZnO), indium oxide ($In_2O_3$), indium gallium oxide (IGO), or aluminium zinc oxide (AZO). If the pixel electrodes 210R, 210G, and 210B include reflective electrodes, the pixel electrodes 210R, 210G, and 210B may include a reflective layer including Ag, Mg, Al, Pt, Pd, Au, Ni, Nd, Ir, Cr, or a combination thereof. The pixel electrodes 210R, 210G, and 210B may also include a layer including ITO, IZO, ZnO, or $In_2O_3$. The structures and materials of the pixel electrodes 210R, 210G, and 210B of the present invention are not limited to the above.

The pixel electrodes 210R, 210G, and 210B may be located in the display area of the substrate 100.

The pixel defining layer 180 includes openings corresponding to sub-pixels. For example, the openings expose the center portions of the pixel electrodes 210R, 210G, and 210B to define the sub-pixels. In an exemplary embodiment, the openings may expose entire pixel electrodes 210R, 210G, and 210B to define the sub-pixels. The pixel defining layer 180 may increase distances between end portions of the pixel electrodes 210R, 210G, and 210B and opposite electrodes (not shown) disposed over the pixel electrodes 210R, 210G, and 210B to prevent an electric arc from occurring at the end portions of the pixel electrodes 210R, 210G, and 210B.

The backplane may also include other various elements. For example, as shown in FIG. 1, a thin film transistor (TFT) is formed on the substrate 100. A capacitor (Cap) is formed on the substrate 100. In addition, a buffer layer 110 is formed on the substrate 100. The buffer layer 110 may serve to prevent impurities of the substrate 100 from infiltrating into a semiconductor layer of the TFT, a gate insulating layer 130 or a gate electrode. An interlayer dielectric 150 is formed on the substrate 100. The interlayer dielectric 150 may serve to insulate source/drain electrodes of the TFT and the gate electrode from each other. A planarizing layer 170 is formed covering the TFT and having a flat upper surface.

Figure 2:
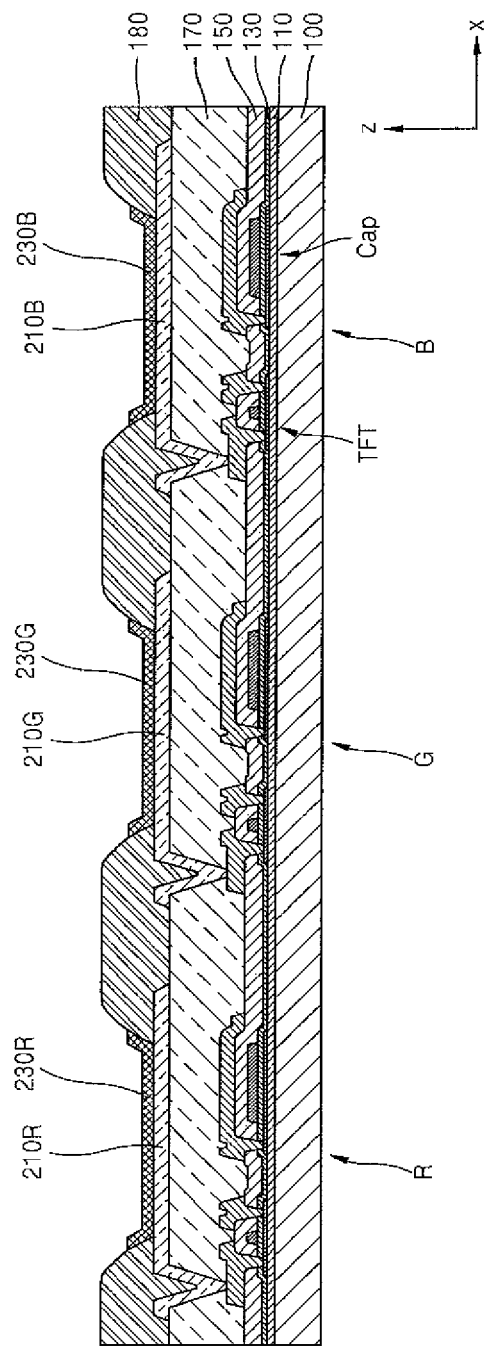

As shown in FIG. 2, intermediate layers 230R, 230G, and 230B are formed on the backplane that is shown in FIG. 1. The intermediate layers 230R, 230G, and 230B may have a multi-layered structure including an emission layer. The intermediate layers 230R, 230G, and 230B include patterned layers corresponding to pixel electrodes 210R, 230G, and 230B, respectively. In an exemplary embodiment, the intermediate layers 230R, 230G, and 230B may include common layers corresponding to an entire surface of the substrate 100 and patterned layers corresponding to the pixel electrodes 210R, 210G, and 210B. The intermediate layers 230R, 230G, and 230B may include a low molecular material or a high molecular material, and may include a hole injection layer, a hole transport layer, an emission layer, an electron transport layer, and/or an electron injection layer. The intermediate layers 230R, 230G, and 230B may be formed by using various deposition methods including, for example, a spin coating method, an inkjet printing method, and/or a laser thermal transfer method.

Figure 3:
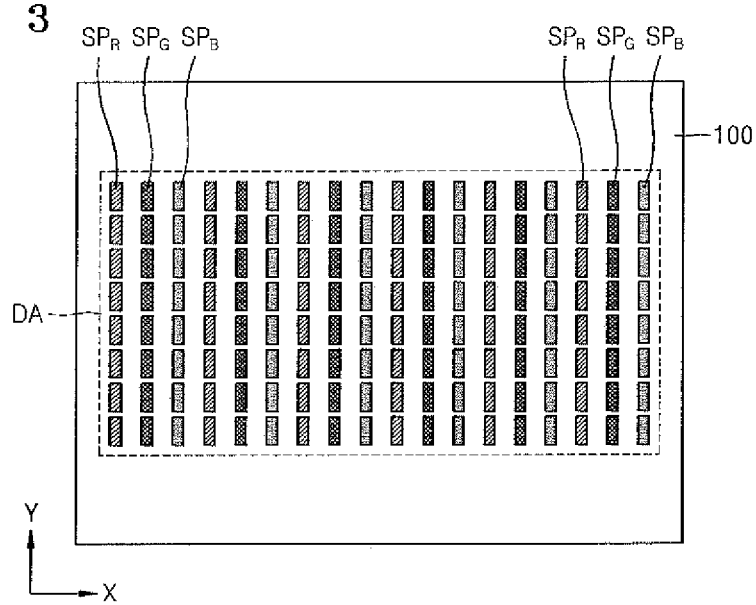

FIG. 3 is a plan view showing the intermediate layers 230R, 230G, and 230B formed as described above. As shown in FIG. 3, sub-pixels emitting light of the same wavelength band are arranged in a first direction (y-axis direction), and sub-pixels emitting light of different wavelengths are alternately arranged in a second direction (x-axis direction) crossing the first direction. For example, sub-pixels $SP_R$ emitting red light, sub-pixels $SP_G$ emitting green light, and sub-pixels $SP_B$ emitting blue light are alternately arranged in the second direction. The sub-pixels $SP_R$, $SP_G$, and $SP_B$ may be located in the display area DA of the substrate 100.

Figure 4:
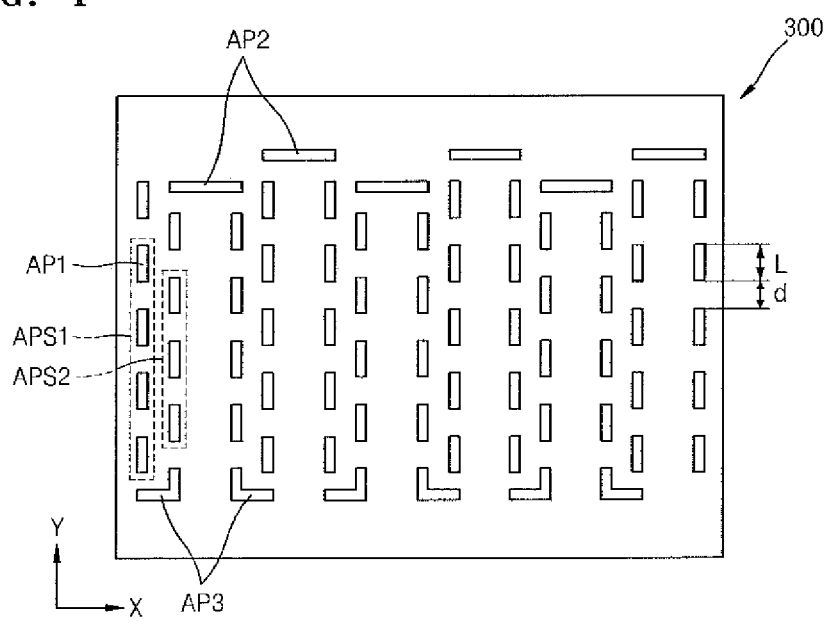
FIG. 4 is a plan view of a mask for manufacturing an organic light emitting display apparatus according to an exemplary embodiment of the present invention.

FIG. 4 is a schematic plan view of a mask 300 that may be used in manufacturing an organic light emitting display apparatus according to an exemplary embodiment of the present invention.

The mask 300 according to an exemplary embodiment includes aperture sets APS1 and APS2 each including a plurality of first apertures AP1 that is arranged in a first direction (y-axis direction). Each of the plurality of first apertures AP1 is spaced apart from each other in the first direction. Here, the aperture sets APS1 and APS2 are located in a second direction (x-axis direction) crossing the first direction. As shown in FIG. 4, the number of first apertures AP1 included in each of the aperture sets APS1 and APS2 may be different from each other. The aperture sets APS1 and APS2 are repeatedly disposed in a mirror image to one another along the second direction. For example, the aperture sets APS1 and APS2 is arranged in a sequence of APS1→APS2→APS2→APS1→APS1→APS2 . . . .

Each of the plurality of first apertures AP1 may have a length L measured in the first direction, wherein the length L may be greater than a distance d between two adjacent first apertures of the plurality of first apertures AP1 in the first direction (y-axis direction). As will be described later, a deposition process may be performed for a plurality of times by moving the mask 300 in the first direction. For example, deposited parts formed by performing a deposition process using the mask 300 may be connected to each other by performing another deposition process using the mask 300.

In addition, the mask 300 also includes a plurality of second apertures AP2 disposed in an upper side of the mask 300. The plurality of second apertures AP2 is spaced apart from each other in the second direction. Each of the plurality of second apertures AP2 is extended in the second direction. The plurality of second apertures AP2 is arranged in zigzag pattern in the second direction. Here, a distance d between two adjacent first apertures AP1 along the first direction may be less than the length L of the first opening AP1 measured in the first direction. As will be described later, when a deposition is repeatedly performed for a predetermined number of times by moving the mask 300 in the first direction, deposited parts may be connected to each other in the first direction with only two times of deposition processes.

In addition, the mask 300 may include a plurality of third apertures AP3 disposed in a lower side of the mask 400. Each of the plurality of third apertures AP3 may have a bent shape including an extension in the first direction and an extension in the second direction. Each of the plurality of third apertures AP3 may be spaced apart from each other in the second direction. Here, a distance between the first apertures AP1 that are closest to the third apertures AP3 and the plurality of third apertures AP3 may be less than the length L of the first apertures AP1 in the first direction. Thus, as described above, when a deposition is performed for multiple times by moving the mask 300 in the first direction, deposited parts may be connected to each other in the first direction with only performing the deposition process twice.

Figure 5:
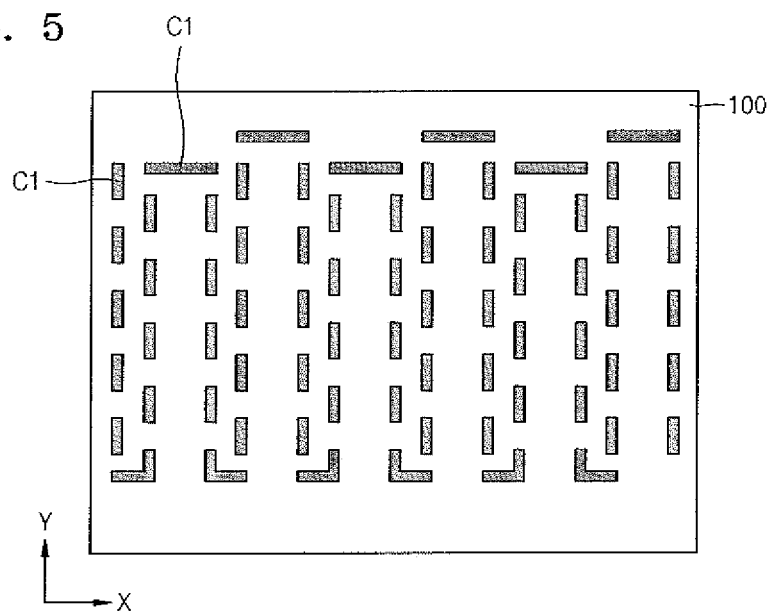
FIGS. 5 and 6 are plan views illustrating an auxiliary patterning layer formed by using the mask shown in FIG. 4 according to an exemplary embodiment of the present invention.
Figure 6:
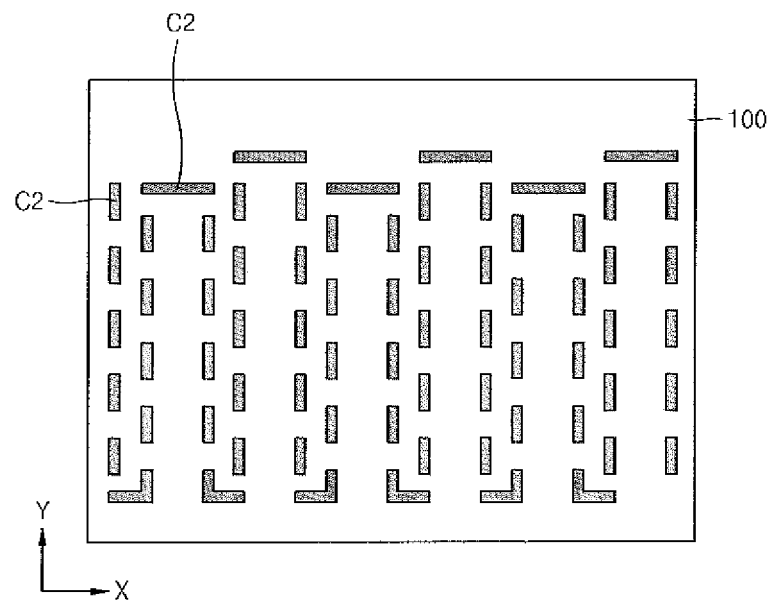
Figure 7:
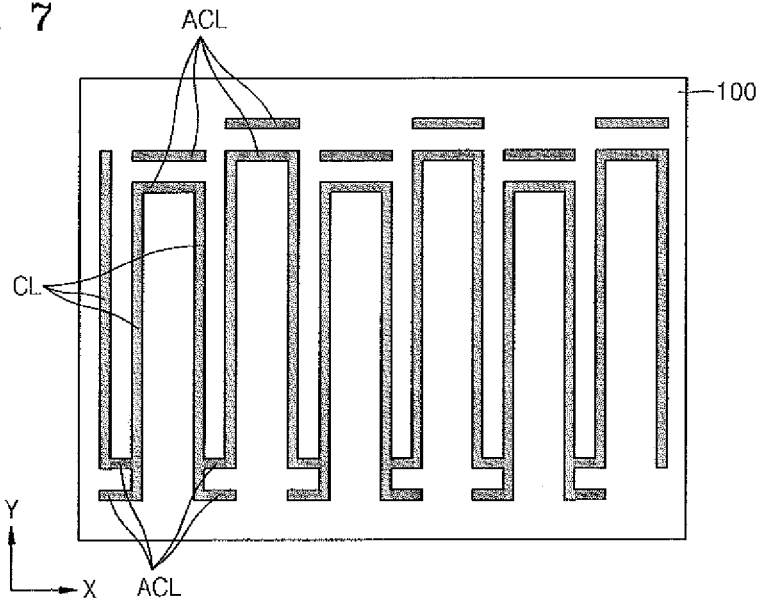
FIGS. 7 through 9 are diagrams illustrating processes of manufacturing an organic light emitting display apparatus according to an exemplary embodiment of the present invention.

FIGS. 5 and 6 are plan views illustrating a process for forming an auxiliary patterning layer of FIG. 7 using the mask 300 shown in FIG. 4. Here, the auxiliary patterning layer may include metal that has a low adhesive property with respect to a conductive material. For example, the auxiliary patterning layer may include 8-Quinolinolato lithium, (N,N-diphenyl-N,N-bis(9-phenyl-9H-carbazol-3-yl)biphenyl-4,4'-diamine), (N(diphenyl-4-yl)9,9-dimethyl-N-(4(9-phenyl-9H-carbazol-3-yl)phenyl)-9H-fluorene-2-amine), or (2-(4-(9,10-di(naphthalene-2-yl)anthracene-2-yl)phenyl)-1-phenyl-1H-benzo-[D]imidazole).

As shown in FIG. 5, part of the auxiliary patterning layer is formed on the substrate 100 by performing a deposition process once using the mask 300 shown in FIG. 4. A first auxiliary patterning layer C1 corresponding to the plurality of first apertures AP1 of the mask 300 is formed on the substrate 100. The first auxiliary patterning layer C1 is formed in the display area of the substrate 100. The first auxiliary patterning layer C1 may also be formed on the peripheral area of the substrate 100. In addition, since the mask 300 includes the plurality of second apertures AP2 and the plurality of third apertures AP3, in addition to the plurality of first apertures AP1, part of the first auxiliary patterning layer C1 formed on the substrate 100 may correspond to the second apertures AP2 and the third apertures AP3 of the mask 300.

Next, as shown in FIG. 4, a second auxiliary patterning layer C2 is formed. For example, the mask 300 may be moved along the first direction (y-axis direction) and may be aligned to partially overlap the first auxiliary patterning layer C1 so that the first auxiliary patterning layer is connected to each other by depositing the second auxiliary patterning layer C2. The second auxiliary patterning layer C2 includes the same pattern as that of the first auxiliary patterning layer C1 and is formed at a different location from that of the first auxiliary patterning layer C1 on the substrate 100 as shown in FIG. 6.

An auxiliary patterning layer of FIG. 7 may be formed by performing two deposition processes using the mask pattern 300. In a first deposition process using the mask pattern 300, the first auxiliary patterning layer C1 may be formed, and in a second deposition process using the mask 300, the second auxiliary patterning layer C2 is formed so that the first auxiliary patterning layer C1 is connected thereto. Through the two deposition processes using the mask 300, the auxiliary patterning layer of FIG. 7 may be formed. The auxiliary patterning layer of FIG. 7 includes a deposition mold including a plurality of auxiliary patterning lines CL formed as stripes that are extended in the first direction (y-axis direction) and that are arranged in the second direction (x-axis direction). In an exemplary embodiment, the auxiliary patterning lines CL may be formed on both the peripheral area and the display area DA of the substrate 100.

In addition, the auxiliary patterning layer of FIG. 7 further includes additional auxiliary patterning lines ACL corresponding to the plurality of second apertures AP2 and the third apertures AP3 of the mask 300, in addition to the plurality of auxiliary patterning lines CL. For example, the second aperture AP2 is extended in the second direction (x-axis direction). Each of the second apertures AP2 are spaced apart from each other in the second direction at an upper side of the mask 300. The third aperture AP3 includes bent shapes including extensions in the first direction (y-axis direction) and extensions in the second direction. Each of the plurality of third apertures AP3 is spaced apart from each other in the second direction at a lower side of the mask 300. The additional auxiliary patterning lines ACL connect two adjacent auxiliary patterning lines CL. For example, the additional auxiliary patterning lines ACL connect lower ends of two adjacent auxiliary patterning lines CL. The additional auxiliary patterning ACL also connect upper ends of two adjacent auxiliary patterning lines CL. Such connections may be alternately repeated along the first direction, as shown in FIG. 7. Some of the additional auxiliary patterning lines ACL exist as islands without connecting the auxiliary patterning lines CL.

Figure 8:
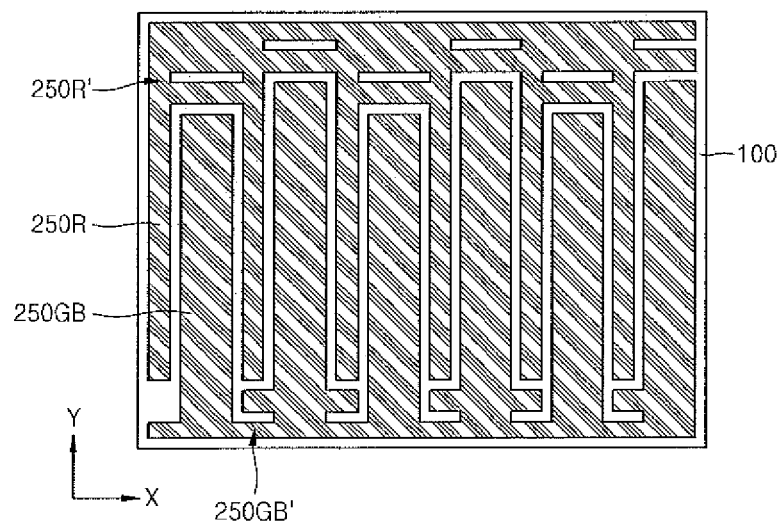

As shown in FIG. 8, a conductive material is deposited on the resulting structure of FIG. 7. The conductive layer may be formed on portions except for the plurality of auxiliary patterning lines CL and the additional auxiliary patterning lines ACL. The plurality of auxiliary patterning lines CL and the additional auxiliary patterning lines ACL may have a low adhesive property with respect to the conductive material, so the conductive layer is not formed on the plurality of auxiliary patterning lines CL and the additional auxiliary patterning lines ACL. Accordingly, the conductive layer may be self-aligned between the plurality of auxiliary patterning lines CL and the additional auxiliary patterning lines ACL to form a plurality of second electrodes 250R and 250GB.

For example, the plurality of second electrodes 250R and 250GB are formed as stripes. The plurality of second electrodes 250R and 250GB are extended in the first direction (y-axis direction) between the plurality of auxiliary patterning lines CL and are arranged in the second direction (x-axis direction). Connection wires CW1 and CW2 are located on the peripheral area, on the display area adjacent to the peripheral area, or throughout the display area and the peripheral area to electrically connect the plurality of second electrodes 250R and 250GB to each other. For example, the connection wire CW1 connects the plurality of second electrodes 250R to each other, and the connection line CW2 connects the plurality of second electrodes 250GB to each other.

In an exemplary embodiment, the conductive material may remain on the auxiliary patterning lines CL and the additional auxiliary patterning lines ACL. However, the second electrodes 250R and 250GB need not be formed as a single body.

Figure 9:
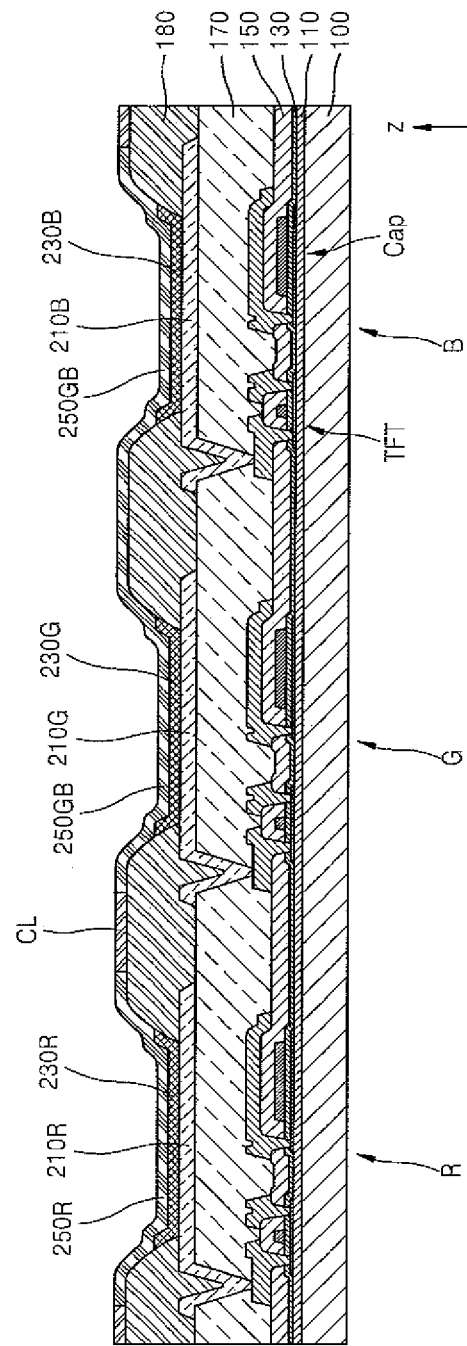

Therefore, when the conductive material is deposited after forming the first auxiliary patterning layer C1 and the second auxiliary patterning layer C2 by using the mask 300 after intermediate layers 230R, 230G, and 230B are formed on the pixel electrodes 210R, 210G, and 210B as shown in FIG. 2, the plurality of second electrodes 250R and 250GB corresponding to the sub-pixels R, G, and B and extending in the first direction (y-axis direction) may be formed as shown in FIG. 9.

The auxiliary patterning lines CL are located between the plurality of second electrodes 250R and 250GB. For example, side surfaces of edges of the auxiliary patterning layer contact corresponding side surfaces of edges in the plurality of second electrodes 250R and 250GB. In FIG. 9, the second electrode 250R is formed as an electrode corresponding to the red sub-pixel R and extending in the first direction. The second electrode 250GB is formed as a common electrode corresponding to both the green sub-pixel G and the blue sub-pixel B and extending in the first direction.

Alternatively, the side surfaces of edges in the plurality of second electrodes 250R and 250GB need not contact the side surfaces of the edges in the auxiliary patterning layer, but may surround the edges of the auxiliary patterning layer.

According to an exemplary embodiment, the second electrode 250R of the red sub-pixel and the second electrode 250GB of the green and red sub-pixel are separately formed, and thus voltages applied to the second electrode 250R of the red sub-pixel and a voltage applied to the second electrode 250GB of the green and blue sub-pixel may be set to be different from each other. Therefore, it is possible to reduce power consumption by using different voltages to drive sub-pixels of the organic light emitting display apparatus according to an exemplary embodiment.

According to an exemplary embodiment of the present invention, the plurality of second electrodes 250R and 250GB of FIG. 8 may be separately formed using the auxiliary patterning lines CL and the additional auxiliary patterning lines ACL as shown in FIG. 7. Accordingly, different voltages may be applied, via the patterned plurality of second electrodes 250R and 250GB, to sub-pixels emitting light of different wavelengths from each other, and thus, total power consumption of the organic light emitting display apparatus may be reduced.

In an exemplary embodiment, when forming the auxiliary patterning layer that does not include the metal material by using the mask 300, the mask 300 may be repeatedly used, and thus, the plurality of second electrodes 250R and 250GB that are patterned may be formed.

In addition, as shown in FIG. 8, the first connection wire CW1 and the second connection wire CW2 may be formed at substantially the same time. The first connection wire CW1 connects the second electrodes 250R, and the second connection wire CW2 connects the second electrodes 250GB. The first connection wire CW1 may include a plurality of openings 250R' corresponding to the additional auxiliary patterning lines ACL disposed on an upper side of the substrate 100. The auxiliary patterning layer may be filled in the plurality of openings 250R'. The second connection wire CW2 may include a plurality of openings 250GB' corresponding to the additional auxiliary patterning lines ACL disposed on a lower side of the substrate 100. For example, the second connection wire CW2 may have bent portions 250GB' as shown in FIG. 8.

Side surfaces of the first connection wire CW1 or the second connection wire CW2 may also contact corresponding side surfaces of the auxiliary patterning layer. Alternatively, the side surfaces of the first connection wire CW1 or the second connection wire CW2 need not contact the side surfaces of the auxiliary patterning layer, but the side surfaces of the first or second connection wire CW1 or CW2 may cover the edges of the auxiliary patterning layer.

As shown in FIG. 8, the second electrodes 250R of the red sub-pixels R are connected to each other via the first connection wire CW1, and the second electrodes 250GB of the green sub-pixels G and the blue sub-pixels B are connected to each other via the second connection wire CW2. In addition, the first connection wire CW1 and the second connection wire CW2 need not be electrically connected to each other. Therefore, different electric signals may be applied to the second electrodes 250R and the second electrodes 250GB. For example, a first common electric signal may be applied to the second electrodes 250R of the red sub-pixels R via the first connection wire CW1 and a second common electric signal may be applied to the second electrodes 250GB of the green sub-pixels G and the blue sub-pixels B via the second connection wire CW2.

As shown in FIG. 8, the second electrodes 250R corresponds to red sub-pixels R which are not electrically connected to the second electrodes 250GB corresponding to green sub-pixels G and blue sub-pixels B; however, the present invention is not limited thereto. For example, the second electrodes of other sub-pixels, other than the red sub-pixels R, are not electrically connected to the second electrodes of the other sub-pixels. For example, the second electrodes for green pixels G are disconnected from the second electrodes for red and blue pixels R and B. In an exemplary embodiment, the second electrodes of the red sub-pixels R, of the green sub-pixels G, and of the blue sub-pixels B are electrically disconnected from each other.

In addition, when the organic light emitting display apparatus is manufactured as described above, a deposition process using the mask 300 shown in FIG. 4 is performed twice to form the plurality of auxiliary patterning lines CL patterned as stripes. The mask 300 includes the first, second, and/or third apertures AP1, AP2, and/or AP3 to form the plurality of auxiliary patterning lines CL patterned as stripes. For example, the first, second, and/or third apertures AP1, AP2, and/or AP3 might not be single openings that are extended from an end of the mask 300 to the other end of the mask 300. Instead, the first, second, and/or third apertures AP1, AP2, and/or AP3 include openings which correspond to part of the auxiliary patterning lines CL. For example, the plurality of first apertures AP1 are arranged to constitute the aperture set APS1 of FIG. 4. The plurality of second apertures AP2 are arranged to constitute the aperture set APS2 of FIG. 4 Therefore, when forming the auxiliary patterning layer by using the mask 300, deformation of the apertures in the mask 300 may be minimized, and accordingly, defective rate in the manufacturing processes of the organic light emitting display apparatus may be greatly reduced and manufacturing yield may be increased.

In an exemplary embodiment, the plurality of second electrodes and the connection wires CW1 and CW2 may include semi-transparent electrode layers or reflective electrode layers. For example, if the second electrodes 250R and 250GB and the connection wires CW1 and CW2 include semi-transparent electrode layers, the second electrodes 250R and 250GB and the connection wires CW1 and CW2 may have multi-layered structures including a first deposition layer including Li, Ca, LiF/Ca, LiF/Al, Al, Ab, Yb, Mg, or a combination thereof and a second deposition layer including a (semi)transparent material such as ITO, IZO, ZnO, or $In_2O_3$. When the second electrodes 250R and 250GB and the connection wires CW1 and CW2 include reflective electrode layers, the second electrodes 250R and 250GB and the connection wires CW1 and CW2 may have a layer including Li, Ca, LiF/Ca, LiF/Al, Al, Yb, Ag, or Mg.

Figure 10:
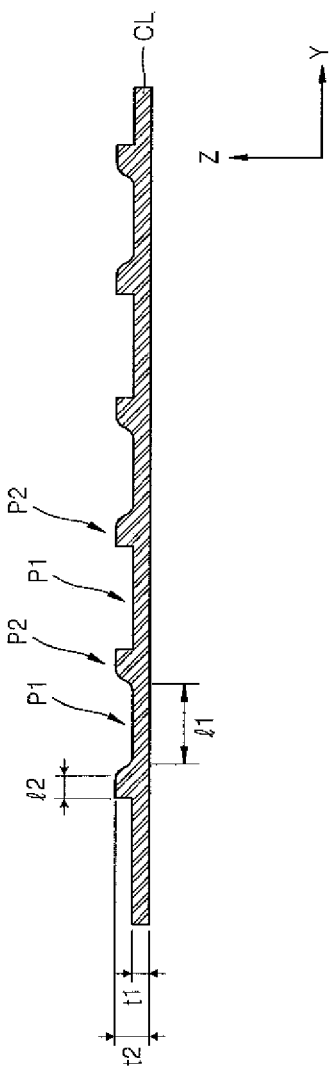
FIG. 10 is a cross-sectional view illustrating part of the auxiliary patterning layer formed by using the mask shown in FIG. 4 according to an exemplary embodiment of the present invention.

FIG. 10 shows an auxiliary patterning line CL in an organic light emitting display apparatus manufactured according to an exemplary embodiment of the present invention. The auxiliary patterning line CL is extended in the first direction (x-axis direction). For example, the auxiliary patterning line CL is formed when the first auxiliary patterning layer C1 and the second auxiliary patterning layer C2 partially overlap each other. The auxiliary patterning line CL includes portions that are periodically arranged along the first direction and that are thicker than the other portions. For example, the auxiliary patterning line CL includes first portions P1 and second portions P2 which are alternately arranged along the first direction. The first portion P1 may have a length l1 in the first direction (y-axis direction) and a thickness t1, and the second portions P2 may have a length l2 in the first direction and a thickness t2 that is greater than t1.

Here, the second portions P2 may corresponds to portions that are formed when the first auxiliary patterning layer C1 and the second auxiliary patterning layer C2 partially overlap each other. The second portions P2 may have the length l2 that is shorter than that of the first portions P1. For example, the length l1 may be greater than the length l2. In an exemplary embodiment, the second portions P2 are formed by depositing the conductive material twice unlike the first portions P1 that are formed by depositing the conductive material once, and thus the thickness t2 may be twice as thick as the thickness t1 of the first portions P1.

If the first aperture AP1 has a length L such that the second portions P2 is longer than the first portions P1, the mask 300 may be subject to deformation. According to the present invention, the first apertures AP1 may have a length L as short as possible. For example, the first aperture AP1 has a length L such that the second portions P2 are shorter than the first portions P1, and thus, deformation of the apertures of the mask 300 may be minimized.

As described above, the plurality of auxiliary patterning lines CL and the additional auxiliary patterning lines ACL may include a material having a low bonding property to the conductive material such as metal. Therefore, bonding forces between the auxiliary patterning layers including the plurality of auxiliary patterning lines CL and the additional auxiliary patterning lines ACL and the plurality of second electrodes may be weaker than those between the plurality of second electrodes and a lower material disposed under the second electrodes. Here, the lower material may include the pixel defining layer 180 or the intermediate layers 230R, 230G, and 230B.

As shown in FIG. 9, the organic light emitting display apparatus according to an exemplary embodiment includes a plurality of first electrodes 210R, 210G, and 210B disposed on a display area of the substrate 100. A plurality of second electrodes 250R and 250GB may be formed as stripes extending in the first direction (y-axis direction) and arranged in the second direction (x-axis direction) crossing the first direction. Intermediate layers 230R, 230G, and 230B may be interposed between the plurality of first electrodes 210R, 210G, and 210B and the plurality of second electrodes 250R and 250GB and may include emission layers. The auxiliary patterning layer may include a plurality of auxiliary patterning lines CL disposed between the plurality of second electrodes 250R and 250GB.

As shown in FIG. 8, the plurality of second electrodes 250R and 250GB may extend from the peripheral area into the display area. In addition, the side surfaces at the edges of the auxiliary patterning layer including the auxiliary patterning lines CL and the additional auxiliary patterning lines ACL contact the side surfaces at the edges of the plurality of second electrodes 250R and 250GB. Some of the conductive material may remain on the auxiliary patterning layer including the auxiliary patterning lines CL and the additional auxiliary patterning lines ACL. In an exemplary embodiment, edges of the plurality of second electrodes 250R and 250GB may cover the edges of the auxiliary patterning lines CL and the additional auxiliary patterning lines ACL. Here, the bonding force between the auxiliary patterning layer and the plurality of second electrodes 250R and 250GB may be weaker than that between the plurality of second electrodes 250R and 250GB and the lower material of the second electrodes 250R and 250GB.

Here, each of the plurality of auxiliary patterning lines CL may have inconsistent thickness along the first direction (y-axis direction) in the display area, as shown in FIG. 10. For example, each of the plurality of auxiliary patterning lines CL may have the first portions P1 having a length l1 in the first direction (y-axis direction) and a thickness t1 and the second portions P2 having a length l2 in the first direction and a thickness t2 that is greater than t1 alternately along the first direction. Here, the second portions P2 that are formed when the first auxiliary patterning layer C1 and the second auxiliary patterning layer C2 partially overlap each other may have the length l2 that is shorter than that of the first portions P1. For example, the length l1 may be greater than the length l2. Moreover, since the second portions P2 are formed by depositing the conductive material twice unlike the first portions P1 that are formed by depositing the conductive material once, the thickness t2 may be twice as thick as the thickness t1 of the first portions P1.

The organic light emitting display apparatus according to an exemplary embodiment of the present embodiment may include the connection wires CW1 and CW2. The connection wires CW1 and CW2 may be located at the peripheral area surrounding the display area, at the display area adjacent to the peripheral area, or throughout the display area and the peripheral area. The connection wires CW1 and CW2 may electrically connect the plurality of second electrodes 250R and 250GB.

According to an exemplary embodiment of the present invention, the auxiliary patterning layer is formed by using the mask 300. The auxiliary patterning layer may include the auxiliary patterning lines CL and the additional auxiliary patterning lines ACL. The conductive material such as metal is deposited throughout the entire surface of the substrate 100, and the plurality of second electrodes 250R and 250GB are formed as stripes on the portions where the auxiliary patterning layer is not formed. Accordingly, voltages applied to the sub-pixels via the second electrodes may be controlled depending on the characteristics of the sub-pixels, and thus, power consumption may be reduced.

According to an exemplary embodiment, as shown in FIG. 8, the first connection wire CW1 and the second connection wire CW2 are formed to connect the second electrode 250R and the second electrode 250GB, respectively. For example, the mask 300 includes the plurality of second apertures AP2 that are extended in the second direction (x-axis direction) and that are spaced apart each other in the second direction. The mask 300 also includes the plurality of third apertures AP3 having bent shapes including extensions in the first direction and extensions in the second direction and spaced apart each other in the second direction. Using the mask 300, the first auxiliary patterning layer C1 is formed, and then the second auxiliary patterning layer C2 is formed so that the first auxiliary patterning layer C1 is connected to each other to form the auxiliary patterning layer of FIG. 7. Using the auxiliary patterning layer of FIG. 7, the first and second connection wire CW1 and CW2 are formed so that the second electrode 250R and the second electrodes 250GB are connected in the second direction as shown in FIG. 8.

According to an exemplary embodiment, the first connection wire CW1 and the second connection wire CW2 are not electrically connected to each other. The electric signals applied to the second electrodes 250R are controlled via the first connection wire CW1, and the electric signals applied to the second electrodes 250GB are controlled via the second connection wire CW2, and thus, the electric signals applied to the second electrodes 250R of the red sub-pixels R may be different from the electric signals applied to the second electrodes 250GB of the green and blue sub-pixels G and B.

In addition, since there are some additional auxiliary patterning lines ACL existing as islands without contacting the plurality of auxiliary patterning lines CL, the first connection wire CW1 may include a plurality of openings 250R' as shown in FIG. 8. In an exemplary embodiment, the auxiliary patterning layer is filled in the plurality of openings 250R'. In addition, as shown in FIG. 7, since the additional auxiliary patterning lines ACL include bent shapes, the second connection wire CW2 includes bent portions 250GB' as shown in FIG. 8.

As shown in FIG. 8, the second electrodes 250R of the stripe shapes correspond to the red sub-pixels R, and the second electrodes 250GB formed as stripes correspond to the green sub-pixels G and the blue sub-pixels B as a single body. However, the second electrodes formed as stripes corresponding to the red sub-pixels R, the second electrodes formed as stripes corresponding to the green sub-pixels G, and the second electrodes formed as stripes corresponding to the blue sub-pixels B may be separately disposed by the auxiliary patterning lines CL.

In this case, the organic light emitting display apparatus may include a first connection wire for connecting the second electrodes corresponding to the red sub-pixels R, a second connection wire for connecting the second electrodes corresponding to the green sub-pixels G, and a third connection wire for connecting the second electrodes corresponding to the blue sub-pixels B. In addition, the first through third connection wires need not be electrically connected to each other. For example, two of the first through third connection wires may be disposed at the same layer as that of the second electrodes (similar to the first and second connection wires CW1 and CW2 shown in FIG. 8), and the other connection wire may be disposed at the same layer as that of the gate electrode or the source/drain electrodes of the TFT. In this case, the other connection wire may be electrically connected to the second electrodes through a via hole formed in the interlayer dielectric 150 and/or the planarizing layer 170.

According to an exemplary embodiment, the organic light emitting display apparatus may reduce power consumption by forming the second electrode having a separate electrode for at least one sub-pixel. However, the scope of the present invention is not limited to the above effects.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. An organic light emitting display apparatus comprising:
    a substrate including a display area on which a plurality of pixels are disposed and a peripheral area adjacent to the display area;
    a plurality of first electrodes located in the display area;
    a plurality of second electrodes formed as stripes and located in the display area, wherein the plurality of second electrodes extend in a first direction and are arranged in a second direction that crosses the first direction;
    an intermediate layer interposed between the plurality of first electrodes and the plurality of second electrodes, the intermediate layer comprising an emission layer; and
    an auxiliary patterning layer disposed between two adjacent second electrodes of the plurality of second electrodes,
    wherein the auxiliary patterning layer has a non-uniform thickness along the first direction.

2. The organic light emitting display apparatus of claim 1, wherein the auxiliary patterning layer comprises first portions and second portions which are alternately arranged in the first direction, wherein the first portions have a first thickness and second portions have a second thickness greater than the first thickness.

3. The organic light emitting display apparatus of claim 2, wherein the first portions have a first length and the second portions have a second length less than the first length, wherein the first length and the second length are measured in the first direction.

4. The organic light emitting display apparatus of claim 3, wherein the second thickness is twice as thick as the first thickness.

5. The organic light emitting display apparatus of claim 1, wherein the plurality of second electrodes extends from the peripheral area to the display area.

6. The organic light emitting display apparatus of claim 1, further comprising a connection wire to electrically connect some of the plurality of second electrodes to each other.

7. The organic light emitting display apparatus of claim 1, wherein the connection wire is disposed in the peripheral area, in a portion of the display area to electrically connect the plurality of second electrodes to each other, or across the display area and the peripheral area.

8. The organic light emitting display apparatus of claim 6, wherein the connection wire extends in the second direction.

9. The organic light emitting display apparatus of claim 1, further comprising a first connection wire and a second connection wire,
    wherein the plurality of second electrodes is disposed between the first connection wire and the second connection wire,
    wherein the first connection wire extends in the second direction to electrically connect first ends of a first group of the plurality of second electrodes, and
    wherein the second connection wire extends in the second direction to electrically connect second ends of a second group of the plurality of second electrodes distinct from the first group, the second ends opposite to the first ends.

10. The organic light emitting display apparatus of claim 9, wherein at least one of the first connection wire and the second connection wire comprises a plurality of apertures.

11. The organic light emitting display apparatus of claim 10, wherein the auxiliary patterning layer is filled in the plurality of apertures.

12. The organic light emitting display apparatus of claim 9, wherein the first connection wire and the second connection wire are not electrically connected to each other.

13. The organic light emitting display apparatus of claim 1, wherein side surfaces at edges of the auxiliary patterning layer contact side surfaces at edges of the plurality of second electrodes.

14. The organic light emitting display apparatus of claim 1, wherein a bonding force between the auxiliary patterning layer and the plurality of second electrodes is weaker than a bonding force between the plurality of second electrodes and a lower layer disposed under the plurality of second electrodes, wherein the lower layer includes the intermediate layer.

15. The organic light emitting display apparatus of claim 14, wherein the auxiliary patterning layer comprises 8-quinolinato lithium, (N,N-diphenyl-N,N-bis(9-phenyl-9H-carbazol-3-yl)biphenyl-4,4'-diamine), (N(diphenyl-4-yl)9,9-dimethyl-N-(4(9-phenyl-9H-carbazol-3-yl)phenyl)-9H-fluorene-2-amine), or 2-(4-(9,10-di(naphthalene-2-yl)anthracene-2-yl)phenyl)-1-phenyl-1H-benzo-[D]imidazole).

* * * * *